(12) United States Patent
Xi

(10) Patent No.: US 12,406,611 B2
(45) Date of Patent: Sep. 2, 2025

(54) SHIFT REGISTER, DRIVER CIRCUIT, DISPLAY PANEL, AND DISPLAY APPARATUS

(71) Applicant: Wuhan Tianma Microelectronics Co., Ltd., Wuhan (CN)

(72) Inventor: Suping Xi, Wuhan (CN)

(73) Assignee: Wuhan Tianma Microelectronics Co., Ltd., Wuhan (CN)

( * ) Notice: Subject to any disclaimer, the term of this patent is extended or adjusted under 35 U.S.C. 154(b) by 0 days.

(21) Appl. No.: 18/736,507

(22) Filed: Jun. 6, 2024

(65) Prior Publication Data

US 2024/0321173 A1  Sep. 26, 2024

(30) Foreign Application Priority Data

Jan. 23, 2024 (CN) .......................... 202410091448.2

(51) Int. Cl.
*G09G 3/20* (2006.01)
*G11C 19/28* (2006.01)

(52) U.S. Cl.
CPC ... *G09G 3/2092* (2013.01); *G09G 2310/0286* (2013.01); *G09G 2310/08* (2013.01); *G11C 19/287* (2013.01)

(58) Field of Classification Search
CPC ......... G09G 3/2092; G09G 2310/0286; G09G 2310/08; G09G 3/20; G09G 3/3677; G09G 2310/06; G09G 2320/02; G11C 19/287; G11C 19/28
See application file for complete search history.

(56) References Cited

U.S. PATENT DOCUMENTS

| 11,043,168 B2 * | 6/2021 | Zhang | G09G 3/20 |
| 2016/0035262 A1 * | 2/2016 | Lee | G09G 3/3266 |
| | | | 345/690 |
| 2021/0150989 A1 * | 5/2021 | Shi | G09G 3/3225 |
| 2021/0335203 A1 * | 10/2021 | Feng | G09G 3/2092 |
| 2022/0406250 A1 * | 12/2022 | Lee | G09G 3/2096 |

FOREIGN PATENT DOCUMENTS

CN  115985224 A  4/2023

* cited by examiner

*Primary Examiner* — Jose R Soto Lopez
(74) *Attorney, Agent, or Firm* — Wiersch Law Group

(57) ABSTRACT

A shift register, a driver circuit, a display panel, and a display apparatus. In the shift register, a first input unit is configured to write a signal into a first node; a first output unit includes a control terminal coupled to the first node, a first terminal receiving a first voltage signal, and a second terminal coupled to a signal output terminal; a second input unit is configured to write a signal into a second node; a second output unit includes a control terminal coupled to the second node, a first terminal receiving a first clock signal, and a second terminal coupled to the signal output terminal; a holding unit includes an output terminal coupled to the second node, and is configured to maintain a potential of the second node at least during a period when the first output unit is off and the second output unit is on.

14 Claims, 7 Drawing Sheets

SHIFT REGISTER, DRIVER CIRCUIT, DISPLAY PANEL, AND DISPLAY APPARATUS

CROSS-REFERENCE TO RELATED APPLICATIONS

The present application claims priority to Chinese Patent Application No. 202410091448.2, filed on Jan. 23, 2024, the content of which is incorporated herein by reference in its entirety.

TECHNICAL FIELD

The present disclosure relates to the field of display technologies, and in particular, to a shift register, a driver circuit, a display panel, and a display apparatus.

BACKGROUND

With the development of display technology, high-resolution, narrow-bezel display panels have become one of the dominant trends in the display technical field, leading to the emergence of gate driver on array (GOA) circuits. The GOA circuit refers to a circuit formed by integrating a gate driver circuit of a display panel directly into a non-display area of an array substrate, which can replace externally connected driver chips of the array substrate and has advantages such as low cost, fewer processes, and high productivity. However, there are fluctuations in the output of a shift register in the gate driver circuit in the related art, which affects the display effect.

SUMMARY

Embodiments of the present disclosure provide a shift register, a driver circuit, a display panel, and a display apparatus, so as to solve the technical problem that fluctuations in the output of the shift register affects the display effect.

According to a first aspect, an embodiment of the present disclosure provides a shift register, including a first input unit, a second input unit, a first output unit, a second output unit, and a holding unit. The first input unit is coupled to a first node and is configured to write a signal into the first node. The first output unit includes a control terminal coupled to the first node, a first terminal receiving a first voltage signal, and a second terminal coupled to a signal output terminal. The second input unit is coupled to a second node and is configured to write a signal into the second node. The second output unit includes a control terminal coupled to the second node, a first terminal receiving a first clock signal, and a second terminal coupled to the signal output terminal. The holding unit includes an output terminal coupled to the second node and is configured to maintain a potential of the second node at least during a period when the first output unit is off and the second output unit is on.

According to a second aspect, based on the same inventive conception, an embodiment of the present disclosure further provides a driver circuit. The driver circuit includes a shift register. The shift register includes a first input unit coupled to a first node and configured to write a signal into the first node, a first output unit, a second input unit coupled to a second node and configured to write a signal into the second node, a second output unit, and a holding unit. The first output unit includes a control terminal coupled to the first node, a first terminal configured to receive a first voltage signal, and a second terminal coupled to a signal output terminal. The second output unit includes a control terminal coupled to the second node, a first terminal configured to receive a first clock signal, and a second terminal coupled to the signal output terminal. The holding unit includes an output terminal coupled to the second node, and configured to maintain a potential of the second node at least during a period when the first output unit is off and the second output unit is on. A plurality of shift registers are cascaded.

According to a third aspect, based on the same inventive conception, an embodiment of the present disclosure further provides a display apparatus. The display apparatus includes a display panel. The display panel includes a driver circuit. The driver circuit includes a shift register. The shift register includes a first input unit coupled to a first node and configured to write a signal into the first node, a first output unit, a second input unit coupled to a second node and configured to write a signal into the second node, a second output unit, and a holding unit. The first output unit includes a control terminal coupled to the first node, a first terminal configured to receive a first voltage signal, and a second terminal coupled to a signal output terminal. The second output unit includes a control terminal coupled to the second node, a first terminal configured to receive a first clock signal, and a second terminal coupled to the signal output terminal. The holding unit includes an output terminal coupled to the second node, and configured to maintain a potential of the second node at least during a period when the first output unit is off and the second output unit is on. A plurality of shift registers are cascaded.

BRIEF DESCRIPTION OF DRAWINGS

To describe the technical solutions in the embodiments of the present disclosure or in the prior art more clearly, the following briefly describes the accompanying drawings required for describing the embodiments or the prior art. Apparently, the accompanying drawings in the following description show some embodiments of the present disclosure, and a person skilled in the art may still derive other drawings from these accompanying drawings without creative efforts.

DESCRIPTION OF EMBODIMENTS

To make the objectives, technical solutions, and advantages of the embodiments of the present disclosure clearer, the technical solutions in the embodiments of the present disclosure will be clearly and completely described below with reference to the accompanying drawings in the embodiments of the present disclosure. Apparently, the described embodiments are some rather than all of the embodiments of the present disclosure. All other embodiments obtained by those of ordinary skill in the art based on the embodiments of the present disclosure without creative efforts should fall within the protection scope of the present disclosure.

Terms used in the embodiments of the present disclosure are only for the purpose of describing specific embodiments, and are not intended to limit the present disclosure. Unless otherwise specified in the context, words, such as "a", "the", and "this", in a singular form in the embodiments of the present disclosure and the appended claims include plural forms.

It should be understood that although the terms "first", "second", and the like may be used to describe XX in the embodiments of the present disclosure, the XX should not be limited to these terms. These terms are merely used to distinguish the XX from one other. For example, without departing from the scope of the embodiments of the present disclosure, a first XX can also be referred to as a second XX. Similarly, a second XX can also be referred to as a first XX.

Figure 1:
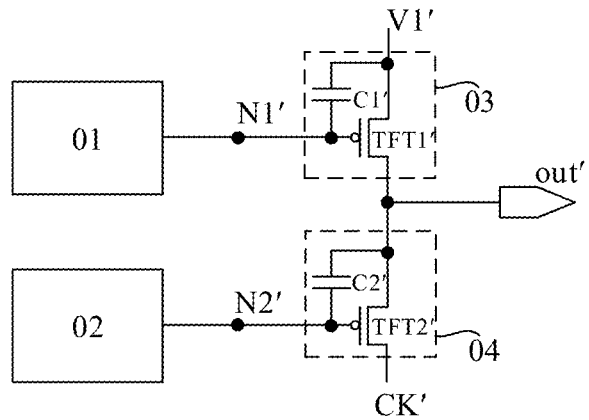
FIG. 1 is a schematic diagram of a shift register in the related art.

FIG. 1 is a schematic diagram of a shift register in the related art. As shown in FIG. 1, the shift register includes a first input unit 01, a second input unit 02, a first output unit 03, and a second output unit 04. The first input unit 01 is configured to write a signal into a first node N1'. The first output unit 03 includes a control terminal coupled to the first node N1', a first terminal receiving a first voltage signal V1', and a second terminal coupled to a signal output terminal OUT'. The second input unit 02 is configured to write a signal into a second node N2'. The second output unit 04 includes a control terminal coupled to the second node N2', a first terminal receiving a first clock signal CK', and a second terminal coupled to the signal output terminal OUT'. The first output unit 03 includes a first output transistor TFT1' and a first capacitor C1', and the second output unit 04 includes a second output transistor TFT2' and a second capacitor C2'. For instance, the first node N1' at a low potential controls a first output transistor TFT1' to be turned on, and the second node N2' at a low potential controls a second output transistor TFT2' to be turned on. Due to the frequent switching of the first clock signal CK' between high and low levels, subjected to the parasitic capacitance of the second output transistor TFT2', the potential of the second node N2' fluctuates, thereby resulting in an impact on the output at the signal output terminal OUT'.

Figure 2:
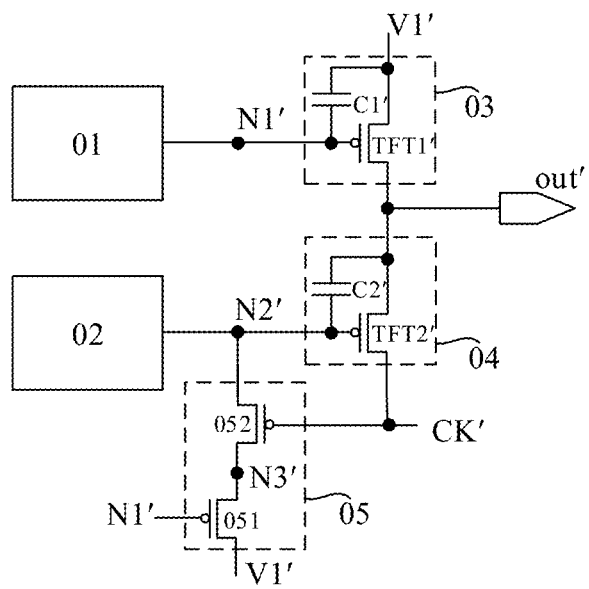
FIG. 2 is a schematic diagram of another shift register in the related art.
Figure 3:
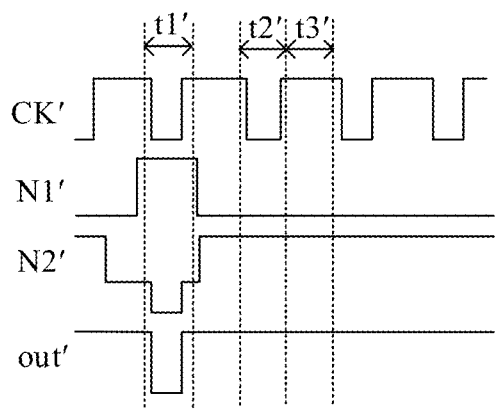
FIG. 3 is a sequence diagram of the shift register as shown in FIG. 2.

In other related technology, FIG. 2 is a schematic diagram of another shift register in the prior art. FIG. 3 is a sequence diagram of the shift register as shown in FIG. 2. As shown in FIG. 2, the shift register further includes a voltage regulator unit 05. The voltage regulator unit 05 is coupled to the second node N2' and is configured to maintain the potential of the second node N2'. The voltage regulator unit 05 includes a first transistor 051 and a second transistor 052. The first transistor 051 includes a control terminal coupled to the first node N1', a first terminal receiving the first voltage signal V1', and a second terminal connected to a third node N3'. The second transistor 052 includes a control terminal receiving the first clock signal CK', a first terminal connected to the third node N3', and the second terminal connected to the second node N2'. Referring to FIG. 3, during a period when the first node N1' is at a low potential and the first clock signal CK' is at a low level, e.g., during a period t2', both the first transistor 051 and the second transistor 052 are turned on to write a high level of the first voltage signal V1' into the second node N2', so as to maintain the high potential of the second node N2'. As a result, the second output transistor TFT2' is turned off, and the signal output terminal OUT' is kept to output a high level. During a period when the first clock signal CK' is at a high level, e.g., during a period t3', the second transistor 052 is turned off, the high potential of the second node N2' is locked, such that the high potential of the second node N2' is maintained. When the first node N1' is at a high potential, the third node N3' is locked. When the first clock signal CK' is at a low level, a floating high potential of the locked third node N3' can affect the second node N2'. For example, during a period t1', i.e., the period when the signal output terminal OUT' outputs a low level, the floating high potential of the latched third node N3' results in fluctuations in the low potential of the second node N2', thus affecting the output, while the low level outputted by the signal output terminal OUT' serves as an enable signal for controlled transistors. Furthermore, in this solution, the control terminal of the second transistor 052 receives the first clock signal CK'. The first clock signal CK' switches frequently between high and low levels. As a result, the potential of the second node N2' will fluctuate due to the parasitic capacitance of the second transistor 052, and the potential fluctuation of the second node N2' will affect the operation of the second output transistor TFT2', and thus affect the output status of the signal output terminal OUT'. After the voltage regulator unit 05 is set in the shift register, during the period when the second output transistor TFT2' is on and the first output transistor TFT1' is off (period t1'), the effect of maintaining the low potential of the second node N2' is worse.

To address the issues in the related art, an embodiment of the present disclosure provides a shift register with a holding unit. During the period when the first output unit is off and the second output unit is on, the signal output terminal of the shift register outputs an enable signal, and the holding unit can maintain the potential of the second node at least during the period when the enable signal is output at the signal output terminal, and ensure the output status of the signal output terminal.

Figure 4:
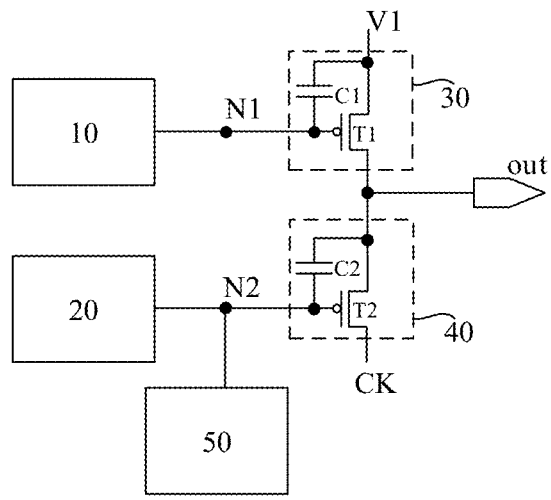
FIG. 4 is a schematic diagram of a shift register according to an embodiment of the present disclosure.

FIG. 4 is a schematic diagram of a shift register according to an embodiment of the present disclosure. As shown in FIG. 4, the shift register includes a first input unit 10, a second input unit 20, a second output unit 40, and a holding unit 50. The first input unit 10 is coupled to a first node N1 and is configured to write a signal into the first node N1. The first output unit 30 includes a control terminal coupled to the first node N1, a first terminal receiving a first voltage signal V1, and a second terminal coupled to a signal output terminal OUT. The second input unit 20 is coupled to a second node N2 and is configured to write a signal into the second node N2. The second output unit 40 includes a control terminal coupled to the second node N2, a first terminal receiving a first clock signal CK, and a second terminal coupled to the signal output terminal OUT. The holding unit 50 includes an output terminal coupled to the second node N2, and the holding unit 50 is configured to maintain the potential of the second node N2 at least during a period when the first output unit 30 is off and the second output unit 40 is on.

In an embodiment, as shown in FIG. 4, the first output unit 30 includes a first output transistor T1 and a first capacitor C1, and the second output unit 40 includes a second output transistor T2 and a second capacitor C2. In an example, as shown in FIG. 4, both the first output transistor T1 and the second output transistor T2 are p-type transistors. The potential of the first node N1 controls the first output transistor T1 to be turned on, to provide the high level of the first voltage signal V1 to the signal output terminal OUT. The potential of the second node N2 controls the second output transistor T2 to be turned on, to provide the level of the first clock signal CK to the signal output terminal OUT. During the period when the first output unit 30 is off and the second output unit 40 is on, the signal output terminal OUT outputs the low level provided by the first clock signal CK as an enable signal to control the transistor coupled to the signal output terminal OUT to be turned on. In other words, during the period when the first output unit 30 is off and the second output unit 40 is on, the stability of the potential of the second node N2 is crucial.

A shift register of an embodiment of the present disclosure includes holding unit 50. The output terminal of the holding unit 50 is coupled to the second node N2. The holding unit 50 can write a signal into the second node N2 at least during the period when the first output unit 30 is off and the second output unit 40 is on. In the period described above, it can smooth the fluctuations in the potential of the second node N2 by directly writing signals into the second node N2, so as to achieve the effective maintenance of the stability of the potential of the second node N2, thereby ensuring the maintenance of the potential of the second node N2 during the period when the signal output terminal OUT outputs an enable signal, and ensuring the output status of the signal output terminal OUT. The application in a display panel can avoid display abnormalities.

Figure 5:
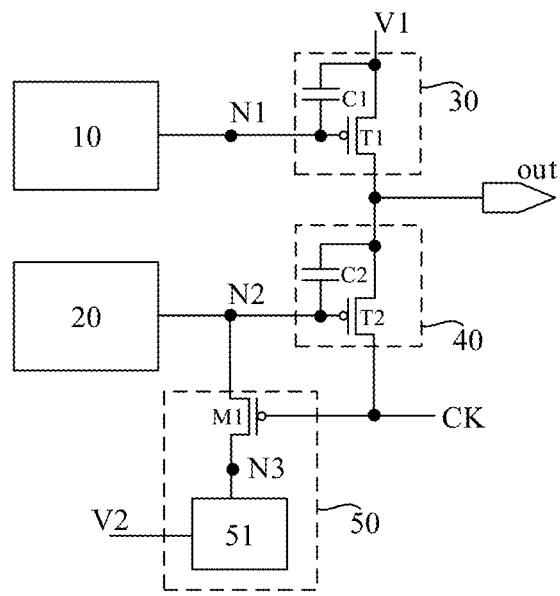
FIG. 5 is a schematic diagram of another shift register according to an embodiment of the present disclosure.
Figure 6:
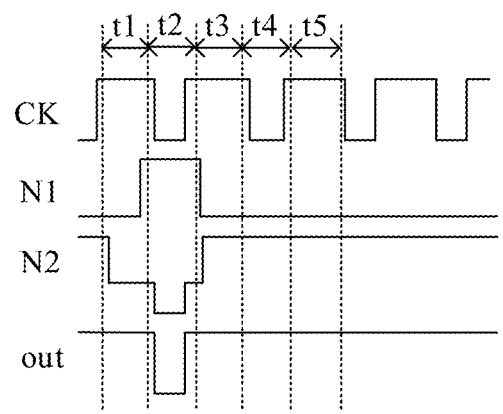
FIG. 6 is a sequence diagram of the shift register provided in the embodiment shown in FIG. 5.

In some embodiments, FIG. 5 is a schematic diagram of another shift register according to an embodiment of the present disclosure, and FIG. 6 is a sequence diagram of the shift register provided in the embodiment shown in FIG. 5. As shown in FIG. 5, the holding unit 50 includes a first transistor M1 and a first subunit 51. A control terminal of the first transistor M1 receives the first clock signal CK. A first terminal of the first transistor M1 and an output terminal of the first subunit 51 are coupled to a third node N3, and a second terminal of the first transistor M1 is coupled to the second node N2. During the period when the first output unit 30 is off and the second output unit 40 is on, the first subunit 51 inputs a second voltage signal V2 to the third node N3, and when turned on, the first transistor M1 writes the second voltage signal V2 into the second node N2 to maintain the potential of the second node N2. In this embodiment, during the period when the signal output terminal OUT needs to output an enable signal, the first subunit 51 in the holding unit 50 directly writes the second voltage signal V2 into the second node N2. The second voltage node V2 can smooth the potential fluctuations of the second node N2, so as to stabilize the potential of the second node N and ensure the on-state of the second output unit 40. In this case, the output of the signal output terminal OUT is ensured. It can reduce the impact caused by the jump of the first clock signal CK on the second node N2 by directly writing the voltage signal directly into the second node N2.

In an example, the first voltage signal V1 is a high-level signal and the second voltage signal V2 is a low-level signal. Referring to FIG. 6, during a period t2, the first node N1 is at a high potential and controls the first output transistor T1 to be turned off, and the second node N2 is at a low potential and controls the second output transistor T2 to be turned on. In other words, during the period t2, the first output unit 30 is off and the second output unit 40 is on. During the period t2, the first subunit 51 inputs the second voltage signal V2 to the third node N3, and the low level of the first clock signal CK controls the first transistor M1 to be turned on to write the second voltage signal V2 into the second node N2. The second node N2 is maintained at a low potential by directly writing a low level into the second node N2, so as to achieve the effective maintenance of the low potential of the second node N2.

Figure 7:
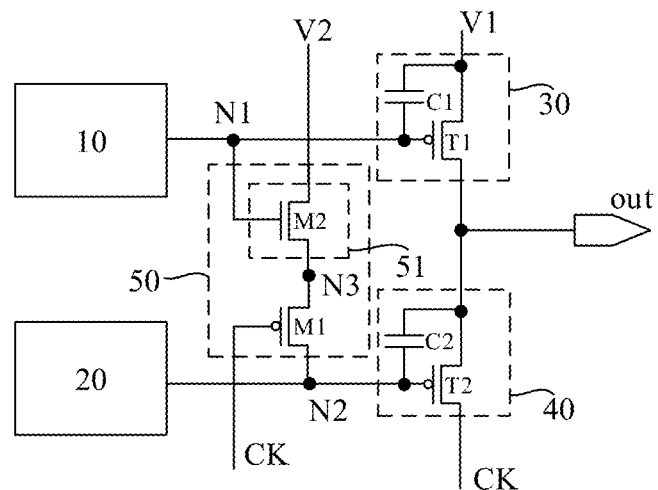
FIG. 7 is a schematic diagram of another shift register according to an embodiment of the present disclosure.

In some embodiments, FIG. 7 is a schematic diagram of another shift register according to an embodiment of the present disclosure. As shown in FIG. 7, a control terminal of the first subunit 51 is coupled to the control terminal of the first output unit 30. FIG. 7 illustrates the coupling of the control terminal of the first subunit 51 with the first node N1. The first subunit 51 includes a first terminal receiving the second voltage signal V2, and a second terminal coupled to the third node N3. Referring to the sequence diagram in FIG. 6, during the period t2, the first node N1 is at a low potential and controls the first subunit 51 to be turned on to write the low level of the second voltage signal V2 into the third node N3. The low level of the first clock signal CK controls the first transistor M1 to be turned on to write the low level into the second node N2, so as to achieve effective maintenance of the low potential of the second node N2, thereby ensuring the on-state of the second output unit 40 and further the output at the signal output terminal OUT. Additionally, in this embodiment, the first subunit 51 is controlled by the potential of the first node N1 to avoid using a clock signal and prevent the voltage jump of the clock signal from affecting the potential of the third node N3, thereby facilitating the stabilization of the potential of the third node N3 and the output stability of the entire circuit.

As shown in FIG. 7, the first subunit 51 includes a second transistor M2. The second transistor M2 includes a control terminal coupled to the control terminal of the first output unit 30, a first terminal receiving the second voltage signal V2, and a second terminal coupled to the third node N3. The first subunit 51 includes one transistor, which makes the structure simple. Moreover, during application, the second transistor M2 can reuse the process of transistors in the display panel.

In an embodiment, the second transistor M2 is an n-type transistor, while other transistors in the shift register are p-type transistors. Referring to the sequence diagram in FIG. 6, during the period t2, the first node N1 is at a high potential, and the first clock signal CK is at a low level. The potential at the first node N1 controls the second transistor M2 to be turned on to write the low level of the second voltage signal V2 into the third node N3, while the first clock signal CK controls the first transistor M1 to be turned on to write the low level into the second node N2. In this case, the potential of the second node N2 can be stabilized by writing a signal into the second node N2, and the fluctuations in the potential of the second node N2 can be smoothed by the signal written in, so that the low potential at the second node N2 can be effective maintained. Additionally, during a period t1, the first clock signal CK is at a high level, the first transistor M1 is turned off, and the third node N3 is in a locked state and does not affect the potential of the second node N2. Furthermore, after the period t2, the first node N1 is at a low potential, the second transistor M2 is turned off and does not write a signal into the third node N3, such that the high potential state of the second node N2 will not be affected.

Figure 8:
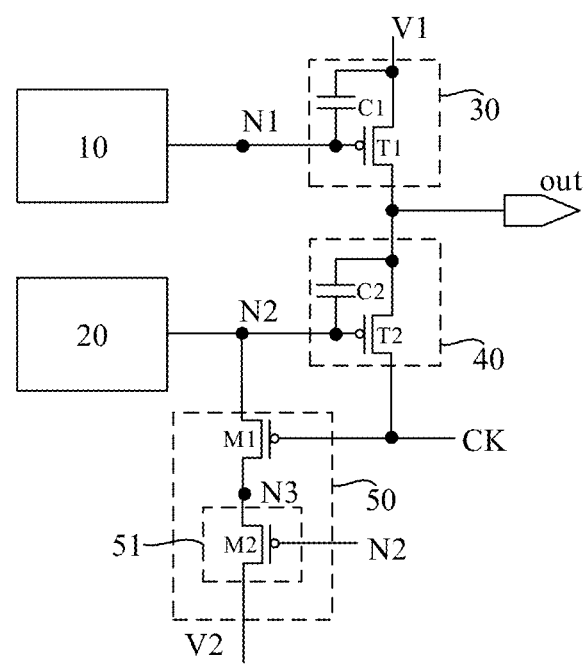
FIG. 8 is a schematic diagram of another shift register according to an embodiment of the present disclosure.

In some embodiments, FIG. 8 is a schematic diagram of another shift register according to an embodiment of the present disclosure. As shown in FIG. 8, the control terminal of the first subunit 51 is coupled to the control terminal of the second output unit 40. FIG. 8 illustrates the coupling of the control terminal of the first subunit 51 with the second node N2. The first subunit 51 includes a first terminal receiving the second voltage signal V2 and a second terminal coupled to the third node N3. Referring to the sequence diagram in FIG. 6, during the period t2, the second node N2 is at a low potential, and controls the first subunit 51 to be turned on to write the low level of the second voltage signal V2 into the third node N3. The low level of the first clock signal CK controls the first transistor M1 to be turned on to write the low level into the second node N2, so as to achieve the effective maintenance of the low potential of the second node N2, thereby ensuring the on-state of the second output unit 40 and the output at the signal output terminal OUT. Additionally, in this embodiment, the first subunit 51 is controlled by the potential of the second node N2 to avoid using a clock signal and prevent the voltage jump of the clock signal from affecting the potential of the third node N3, thereby facilitating the stabilization of the potential of the third node N3 and the stability of the entire circuit.

As shown in FIG. 8, the first subunit 51 includes a second transistor M2. The second transistor M2 includes a control terminal coupled to the control terminal of the second output unit 40, a first terminal receiving the second voltage signal V2, and a second terminal coupled to the third node N3. The first subunit 51 includes one transistor, which makes the structure simple. Moreover, during application, the second transistor M2 can reuse the process of transistors in the display panel.

In an embodiment, the second transistor M2 and other transistors in the shift register are all p-type transistors. Referring to the sequence diagram in FIG. 6, during the period t2, the second node N2 is at a low potential, and the first clock signal CK is at a low level. The potential at the second node N2 controls the second transistor M2 to be turned on to write the low level of the second voltage signal V2 into the third node N3, while the first clock signal CK controls the first transistor M1 to be turned on to write the low level into the second node N2. In this case, the potential of the second node N2 is stabilized by writing a signal to the second node N2, and the fluctuations in the potential of the second node N2 can be smoothed by the signal written in, so as to achieve the effective maintenance of the low potential at the second node N2. Additionally, during a period t1, the first clock signal CK is at a high level, the first transistor M1 is turned off, and the third node N3 is in a locked state and does not affect the potential of the second node N2. Furthermore, after the period t2, the second node N2 is at a high potential, the second transistor M2 is turned off. Thus, the second transistor M2 does not write a signal to the third node N3, such that the high potential state of the second node N2 will not be affected.

Figure 9:
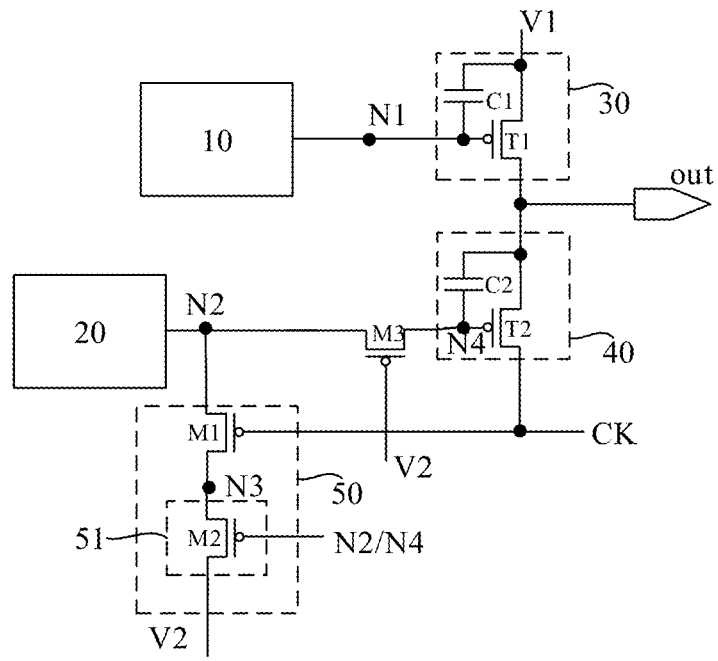
FIG. 9 is a schematic diagram of another shift register according to an embodiment of the present disclosure.

In some embodiments, FIG. 9 is a schematic diagram of another shift register according to an embodiment of the present disclosure. As shown in FIG. 9, the shift register includes a third transistor M3. The third transistor M3 includes a first terminal coupled to the second node N2, a second terminal coupled to the control terminal of the second output unit 40, and a control terminal receiving the second voltage signal V2. The second voltage signal V2 controls the third transistor M3 to be in a normally-on state. The second input unit 20 writes signals into the second node N2, and then the third transistor M3 writes the signals into a fourth node N4. As a result, there is a voltage difference between the second node N2 and the fourth node N4. Additionally, since the control terminal of the second output transistor T2 is electrically connected to the fourth node N4, when the first clock signal CK jumps from a high level to a low level, the potential of the fourth node N4 is pulled down through coupling. As the third transistor M3 is in a normally-on state, the fourth node N4 leaks current to the second node N2, so that the potential of the fourth node N4 is lower than that of the second node N2.

FIG. 9 schematically illustrates that the holding unit 50 is electrically connected to the second node N2, and the second output unit 40 is coupled to the second node N2 via the third transistor M3.

In this embodiment of the present disclosure, the control terminal of the second transistor M2 in the first subunit 51 is coupled to the control terminal of the second output unit 40. The control terminal of the second transistor M2 may be coupled to the second node N2, or the control terminal of the second transistor M2 may be coupled to the fourth node N4. Since the potential of the fourth node N4 is lower than the potential of the second node N2, when the control terminal of the second transistor M2 is coupled to the fourth node N4, it can be ensured that the second transistor M2 is at a sufficient on-state during the period t2, such that the second transistor M2 can effectively write a low-level signal into the third node N3.

FIG. 9 only schematically illustrates the coupling of the control terminal of the second transistor M2 in the first subunit 51 with the control terminal of the second output unit 40. The solution that the control terminal of the first subunit 51 is coupled to the control terminal of the first output unit 30 as shown in FIG. 7 is also applicable to the solution that the third transistor M3 is provided.

Figure 10:
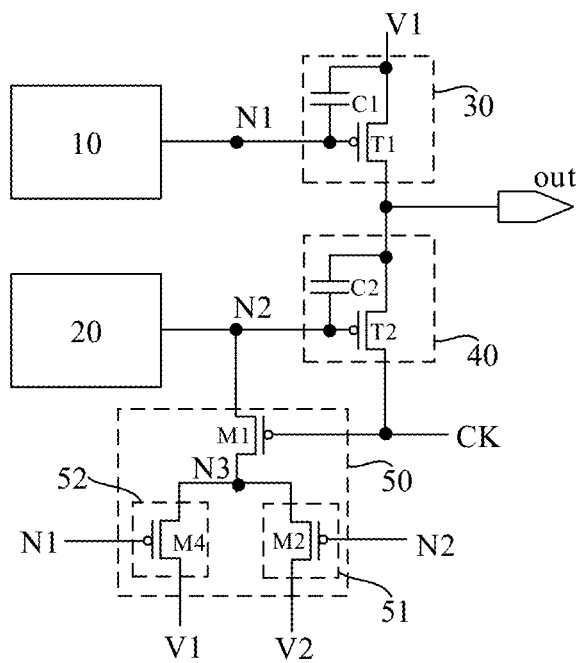
FIG. 10 is a schematic diagram of another shift register according to an embodiment of the present disclosure.

In some embodiments, FIG. 10 is a schematic diagram of another shift register according to an embodiment of the present disclosure. As shown in FIG. 10, the holding unit 50 is also configured to maintain the potential of the second node N2 during the period when the first output unit 30 is on and the second output unit 40 is off. The holding unit 50 further includes a second subunit 52. The second subunit 52 includes an output terminal coupled to the third node N3. During the period when the first output unit 30 is on and the second output unit 40 is off, the second subunit 52 inputs the first voltage signal V1 to the third node N3, and when turned on, the first transistor M1 writes the first voltage signal V1 into the second node N2 to maintain the potential of the second node N2.

The first voltage signal V1 is a high-level signal and the second voltage signal V2 is a low-level signal. That is, a voltage value of the first voltage signal V1 is greater than a voltage value of the second voltage signal V2. The first node N1 is at a low potential, and controls the first output unit 30 to be turned on. The second node N2 is at a low potential, and controls the second output unit 40 to be turned on. Referring to FIG. 6, the period t4 is a period when the first output unit 30 is on and the second output unit 40 is off. The period t4 succeeds the period t2. In other words, the period t4 arrives after the signal output terminal OUT outputs the enable signal. During the period t4, the first node N1 is at a low potential and controls the second subunit 52 to be turned on to write the high level of the first voltage signal V1 into the third node N3. The first clock signal CK is at a low level and controls the first transistor M2 to be turned on to write the high-level signal into the second node N2. The second node N2 is at a high potential, and the first subunit 51 is in an off state. During a period t5 after the period t4, the first clock signal CK is at a high potential, the first transistor M1 is in an off state, and the potential of the third node N3 is locked. Due to frequent jumps of the first clock signal CK between high and low levels, the periods t4 and t5 occur alternately after the period t2. During the period t4, the high-level signal can be written into the second node N2, so as to mitigated the fluctuation of the potential of the second node N2 caused by the voltage jump of the first clock signal CK, thereby effectively maintaining the high potential state of the second node N2.

In this embodiment, the holding unit 50 includes the first transistor M1, the first subunit 51, and the second subunit 52. During the period t1, the first input unit 10 is turned on, a low level is written into the first node N1, the second input unit 20 is turned on, and a low level is written into the second node N2. During the period t1, the first clock signal CK is at a high level and controls the first transistor M1 to be turned off, so that the third node N3 is locked, the potential of the second node N2 will not be affected. During the period t2, the first subunit 51 is in an off state, while the second subunit 52 is turned on to write the low level of the second voltage signal V2 into the third node N3. The first clock signal CK controls the first transistor M1 to be turned on to write the low level into the second node N2. By directly writing the signal into the second node N2, the second node N2 is maintained at the low level. During the period t3 after the period t2, the first input unit 10 is turned on, a low level is written into the first node N1, the second input unit 20 is turned on, and a high level is written into the second node N2. During the period t4, the first node N1 is at a low potential and controls the second subunit 52 to be turned on to write the high level of the first voltage signal V1 into the third node N3. The first clock signal CK controls the first transistor M1 to be turned on to write the high-level signal into the second node N2. During the period t5, the first clock signal CK is at a high potential, and therefore the first transistor M1 is in an off state, and the potential of the third node N3 is locked. Due to frequent jumps of the first clock signal CK between high and low levels, the periods t4 and t5 occur alternately. During the period t4, the high-level signal can be written into the second node N2. Therefore, the fluctuations in the potential of the second node N2 caused by the voltage jump of the first clock signal CK can be mitigated, thereby maintaining the high potential state of the second node N2 effectively. In this embodiment, both the high potential and the low potential of the second node N2 can be effectively maintained, so that the second node N2 can be prevented from being affected by the frequent jumps of the clock signal, thereby effectively maintaining the stability of the second node N2. As a result, the output at the signal output terminal OUT can be stabilized, and the display effect in applications can be ensured.

FIG. 10 schematically illustrates that the first subunit 51 includes the second transistor M2, and the control terminal of the second transistor M2 is coupled to the control terminal of the second output unit 40. In an embodiment, the holding unit 50 includes the second subunit 52, and the control terminal of the first subunit 51 in the holding unit 50 can also be coupled to the control terminal of the first output unit 30 (as shown in FIG. 7), which is not illustrated herein with reference to drawings.

As shown in FIG. 10, the second subunit 52 includes a fourth transistor M4. The fourth transistor M4 includes a control terminal coupled to the first node N1, a first terminal receiving the first voltage signal V1, and a second terminal coupled to the third node N3. Referring to FIG. 6, during the period t4, the potential of the first node N1 controls the fourth transistor M4 to be turned on to write the high level of the first voltage signal V1 into the third node N3. Simultaneously, the first clock signal CK controls the first transistor M1 to be turned on to write the high level to the second node N2, thereby maintaining the high potential state of the second node N2.

Figure 11:
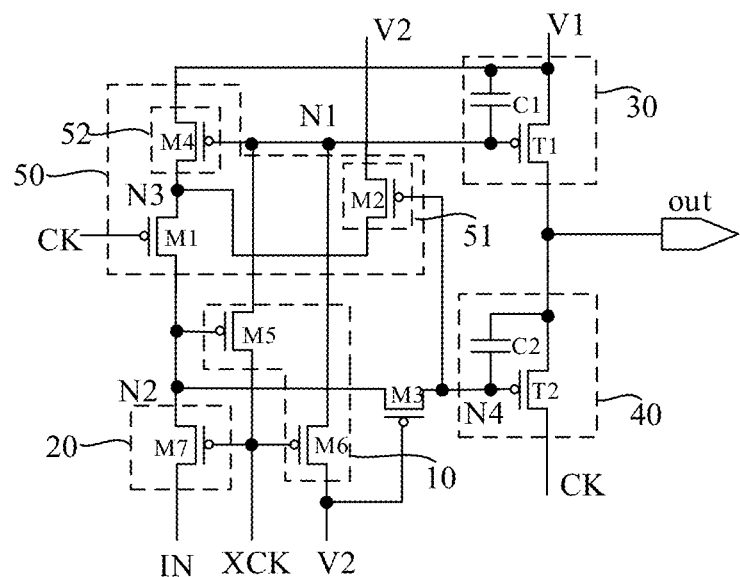
FIG. 11 is a schematic diagram of another shift register according to an embodiment of the present disclosure.

In some embodiments, FIG. 11 is a schematic diagram of another shift register according to the present disclosure. As shown in FIG. 11, the first input unit 10 includes a fifth transistor M5 and a sixth transistor M6. The fifth transistor M5 includes a control terminal coupled to the second node N2, a first terminal receiving a second clock signal XCK, and a second terminal coupled to the first node N1. The sixth transistor M6 includes a control terminal receiving the second clock signal XCK, a first terminal receiving the second voltage signal V2, and a second terminal coupled to the first node N1.

As shown in FIG. 11, the second input unit 20 includes a seventh transistor M7, the seventh transistor M7 includes a control terminal receiving the second clock signal XCK, a first terminal coupled to a signal input terminal IN, and a second terminal coupled to the second node N2. In some embodiments, the seventh transistor M7 may be a dual-gate transistor.

Figure 12:
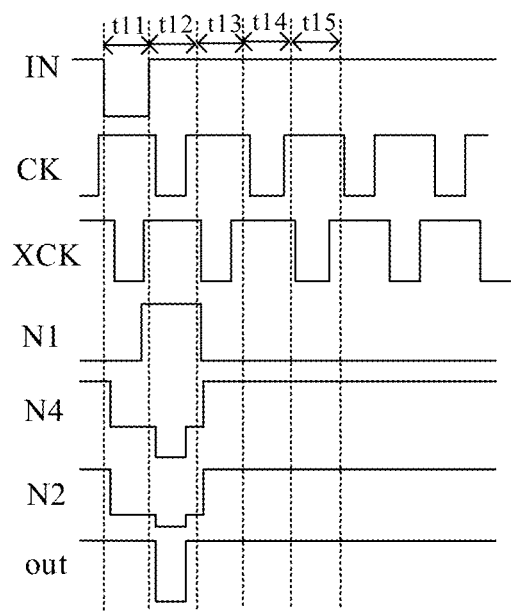
FIG. 12 is another sequence diagram of a shift register according to an embodiment of the present disclosure.

FIG. 12 is another sequence diagram of a shift register according to an embodiment of the present disclosure. The sequence diagram in FIG. 12 is applicable to the shift register as shown in FIG. 11. The operation of the shift register is illustrated with reference to FIG. 11 and FIG. 12.

During a period t11, the first clock signal CK is at a high level, and the second clock signal XCK is at a low level. The second clock signal XCK controls the sixth transistor M6 in the first input unit 10 to be turned on to write the low level of the second voltage signal V2 into the first node N1. The second clock signal XCK controls the seventh transistor M7 in the second input unit 20 to be turned on to write the low level of the signal input terminal IN into the second node N2. The second voltage signal V2 controls the third transistor M3 to be normally on. A low potential is written into the fourth node N4. The fourth node N4 controls the second output transistor T2 in the second output unit 40 to be turned on to provide a high-level signal to the signal output terminal OUT. Simultaneously, the second node N2 controls the fifth transistor M5 in the first input unit 10 to be turned on to write the low level of the second clock signal XCK into the first node N1. The first node N1 is at a low potential and controls the first output transistor T1 in the first output unit 30 to be turned on to provide the high level of the first voltage signal V1 to the signal output terminal OUT. During the period t11, the signal output terminal OUT outputs a high-level signal. Additionally, during the period t11, the low potential of the first node N1 controls the fourth transistor M4 in the second subunit 52 to be turned on to write the high level of the first voltage signal V1 into the third node N3. However, since the first clock signal CK is at a high level, the first transistor M1 in the holding unit 50 is in an off-state, and the potential of the third node N3 is locked. Therefore, the holding unit 50 does not affect the potential of the second node N2.

During a period t12, the first clock signal CK is at a low level, and the second clock signal XCK is at a high level. The second clock signal XCK controls the sixth transistor M6 in the first input unit 10 and the seventh transistor M7 in the second input unit 20 to be turned off. The second node N2 is maintained at the low potential, and therefore the fourth node N4 is also maintained at the low potential. The fourth node N4 controls the second output unit 40 to be in an on-state. The low potential of the second node N2 controls the fifth transistor M5 in the first input unit 10 to be turned on to write the high level of the second clock signal XCK into the first node N1, and therefore the first node N1 is at a high potential. The high potential of the first node N1 controls the first output unit 30 to be turned off. During this period, the first output unit 30 is off and the second output unit 40 is on, and the signal output terminal OUT outputs the low level of the first clock signal CK. Simultaneously, during this period, as the first clock signal CK jumps from a high level to a low level, and the potential of the fourth node N4 is pulled low due to coupling effects, it can be seen from FIG. 12 that, during the period t12, the potential of the fourth node N4 is lower than the potential of the second node N2.

Furthermore, during the period t12, the high potential of the first node N1 controls the fourth transistor M4 in the second subunit 52 to be turned off. The low potential of the fourth node N4 controls the second transistor M2 in the first subunit 51 to be turned on to write the low level of the second voltage signal V2 into the third node N3. During this period, the third node N3 is not in a floating state, but jumps from a high level to a low level after a signal is written into the third node N3. Simultaneously, the first clock signal CK controls the first transistor M1 to be turned on to write the low level of the third node N3 into the second node N2, so that the potential of the second node N2 can be stabilized by writing a signal to the second node N2. In this case, the fluctuations in the potential of the second node N2 can be smoothed by the signal written in, thereby effectively maintaining the low potential of the second node N2 and further the potential of the fourth node N4, and ensuring the second output unit 40 to be in an on-sate and a stable output at the signal output terminal OUT.

During a period t13, the first clock signal CK is at a high level, and the second clock signal XCK is at a low level. The second clock signal XCK controls the sixth transistor M6 in the first input unit 10 to be turned on to write the low level of the second voltage signal V2 into the first node N1. The first node N1 controls the first output unit 30 to be turned on. The second clock signal XCK controls the seventh transistor M7 in the second input unit 20 to be turned on to write the high level of the signal input terminal IN into the second node N2. The third transistor M3 is normally on to write a high potential into the fourth node N4. The fourth node N4 controls the second output unit 40 to be turned off. During this period, the first output unit 30 is on and the second output unit 40 is off, and the signal output terminal OUT outputs the high level of the first voltage signal V1. During this period, the second subunit 52 in the holding unit 50 writes a high-level signal into the third node N3, while the first transistor M1 is in an off-state.

During a period t14, the first clock signal CK is at a low level, and the second clock signal XCK is at a high level. The second clock signal XCK controls the sixth transistor M6 in the first input unit 10 and the seventh transistor M7 in the second input unit 20 to be turned off, and the second node N2 maintains the high potential from the previous period. Accordingly, the fifth transistor M5 in the first input unit 10 is also off, the first node N1 maintains the low potential from the previous period, and the fourth node N4 also maintains the high potential from the previous period. During this period, the first output unit 30 is on and the second output unit 40 is off. During this period, the low potential of the first node N1 controls the second subunit 52 to be turned on to write the high level of the first voltage signal V1 into the third node N3. The low level of the first clock signal CK controls the first transistor M1 to be turned on to write the high-level signal into the second node N2. The second node N2 is at a high potential, and thus the first subunit 51 is in an off-state, so as to maintain the high potential state of the second node N2 during this period and further the high potential state of the fourth node N4, and further to remain the second output unit 40 off.

During a period t15, the first node N1 is at a low potential and the second node N2 is at a high potential. During this period, the first output unit 30 is on and the second output unit 40 is off. During this period, the first clock signal CK is at a high potential, the first transistor M1 is in an off state, and the potential of the third node N3 is locked. Additionally, during the periods t14 and t15, the first subunit 51 remains off. Due to frequent jumps of the first clock signal CK between high and low levels, periods t14 and t15 occur alternately after the period t13. During the period t14, the high-level signal can be written into the second node N2. Therefore, the fluctuations in the potential of the second node N2 caused by the voltage jump of the first clock signal CK can be mitigated, thereby effectively maintaining the high potential state of the second node N2.

In some embodiments of the present disclosure, the holding unit 50 can write a low level into the second node N2 during the period t12, so as to effectively maintain the low potential state of the second node N2. Meanwhile, the holding unit 50 can also write a high level into the second node N2 during the period t14, so as to effectively maintain the high potential state of the second node N2 after the period t12. In this case, the stability of the output of the shift register can be ensured, as well as the display effect in applications.

In an embodiment, as shown in FIG. 11, the holding unit 50 includes the first transistor M1, the first subunit 51, and the second subunit 52. The first subunit 51 includes the second transistor M2, and the second subunit 52 includes the fourth transistor M4. The control terminal of the second transistor M2 is coupled to the control terminal of the second output unit 40. All transistors in the shift register are p-type transistors.

Figure 13:
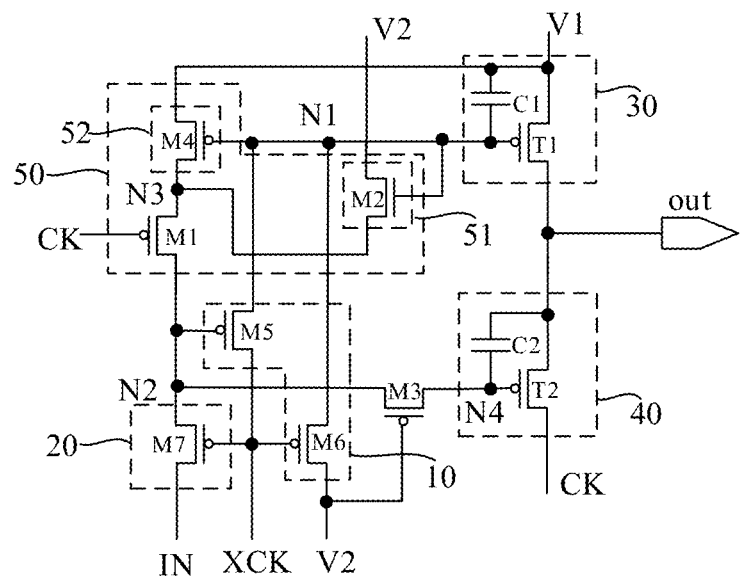
FIG. 13 is a schematic diagram of another shift register according to an embodiment of the present disclosure.

In another embodiment, FIG. 13 is a schematic diagram of another shift register according to an embodiment of the present disclosure. As shown in FIG. 13, the first input unit 10 includes a fifth transistor M5 and a sixth transistor M6, and the second input unit 20 includes a seventh transistor M7. The holding unit 50 includes the first transistor M1, the first subunit 51, and the second subunit 52. The first subunit 51 includes the second transistor M2, and the second subunit 52 includes the fourth transistor M4. The control terminal of the second transistor M2 is coupled to the control terminal of the first output unit 30. The second transistor M2 is an n-type transistor, while other transistors are p-type transistors.

The sequence diagram in FIG. 11 is also applicable to the shift register as shown in FIG. 13. During the period t12, the high potential of the first node N1 controls the fourth transistor M4 in the second subunit 52 to be turned off. The first node N1 also controls the second transistor M2 in the first subunit 51 to be turned on to write the low level of the second voltage signal V2 into the third node N3. During this period, the third node N3 is not in a floating state, but jumps from a high level to a low level after a signal is written into the third node N3. Simultaneously, the first clock signal CK controls the first transistor M1 to be turned on to write the low level of the third node N3 into the second node N2, so that the potential of the second node N2 can be stabilized by writing a signal to the second node N2. In this case, the fluctuations in the potential of the second node N2 can be smoothed by the signal written in, so as to achieve effective maintenance of the low potential of the second node N2 and further the potential of the fourth node N4, thereby ensuring the second output unit 40 to be in an on-sate and a stable output at the signal output terminal OUT. In addition, during the period t14, the low potential of the first node N1 controls the second subunit 52 to be turned on and controls the first subunit 51 to be turned off. After turned on, the second subunit 52 writes the high level of the first voltage signal V1 into the third node N3. The low level of the first clock signal CK controls the first transistor M1 to be turned on to write the high-level signal into the second node N2. The second node N2 is at a high potential. In this case, the second node N2 can be maintained at a high potential state during this period, the high potential state of the fourth node N4 can be maintained, and the second output unit 40 remains off. During the period t15, the first transistor M1 is in an off state, the first subunit 51 remains off, and the potential of the third node N3 is locked. Due to frequent jumps of the first clock signal CK between high and low levels, the periods t14 and t15 occur alternately after the period t13. During the period t14, the high-level signal can be written into the second node N2. Therefore, the fluctuations in the potential of the second node N2 caused by the voltage jump of the first clock signal CK can be mitigated, thereby maintaining the high potential state of the second node N2 effectively.

Referring to FIG. 11 and FIG. 12, a working cycle of the shift register includes a first output stage and a second output stage. The first output stage is prior to the second output stage.

In the first output stage, the second input unit 20 is turned on to write a signal into the second node N2, and the first input unit 10 is turned on to write a signal into the first node N1, The potential of the first node N1 controls the first output unit 30 to be turned on. The potential of the second node N2 controls the second output unit 40 to be turned on. The first output stage is the period t11 in FIG. 12. The first output stage is equivalent to a signal writing stage of the shift register.

In the second output stage, the first input unit 10 is turned on to write a signal into the first node N1, and the potential of the first node N1 controls the first output unit 30 to be turned off. The second input unit 20 is turned off, and the holding unit 50 is turned on to maintain the potential of the second node N2. The potential of the second node N2 controls the second output unit 40 to be turned on. The second output stage, i.e., the period t12 in FIG. 12, is equivalent to a signal output stage of the shift register. Signals are written during the period t11, and are output during the period t12, so as to achieve the function of signal shift. Moreover, the second output stage is the period when the first output unit 30 is off and the second output unit 40 is on. During the period t12, the holding unit 50 is turned on to write a low level into the second node N2, so as to maintain the potential of the second node N2, thereby ensuring the output stability of the signal output terminal OUT.

The working cycle of the shift register according to these embodiments of the present disclosure further includes a third output stage. The third output stage is subsequent to the second output stage. Referring to FIG. 11 and FIG. 12, the period t14 is the third output stage. In the third output stage, the first input unit 10 is turned off, and the potential of the first node N1 controls the first output unit 30 to be turned on. The second input unit 20 is turned off, and the holding unit 50 is turned on to maintain the potential of the second node N2. The potential of the second node N2 controls the second output unit 40 to be turned off. The third output stage is the period when the first output unit 30 is on and the second output unit 40 is off. During the period t14, the holding unit 50 is turned on to write a high level into the second node N2, to maintain the potential of the second node N2, so as to mitigate the potential fluctuations of the second node N2 caused by the voltage jump of the first clock signal CK, thereby effectively maintaining the high potential state of the second node N2, and ensuring the output stability of the signal output terminal OUT.

Figure 14:
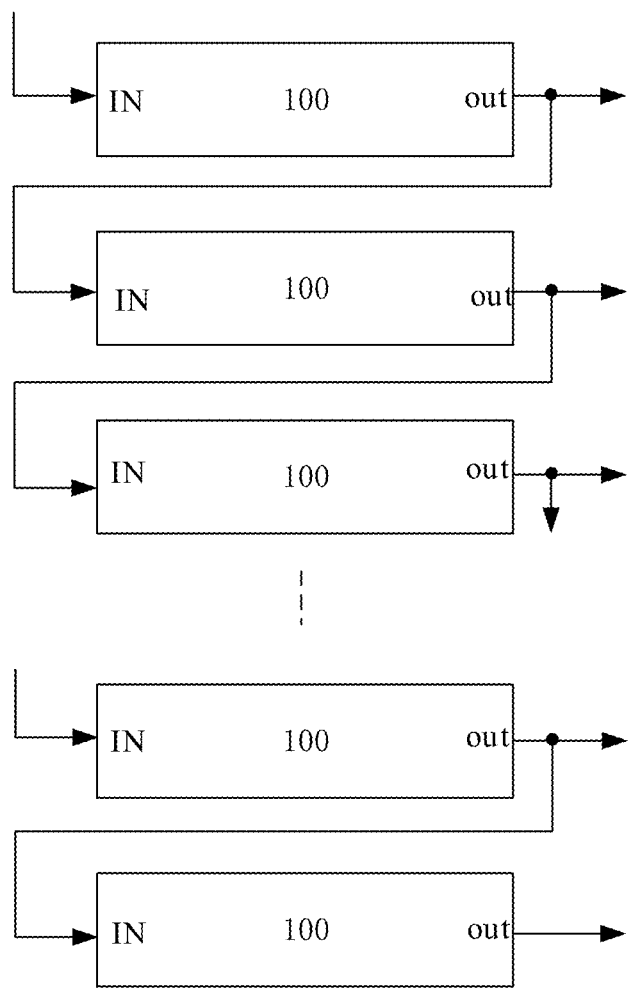
FIG. 14 is a schematic diagram of a driver circuit according to an embodiment of the present disclosure.

Based on the same inventive conception, an embodiment of the present disclosure further provides a driver circuit. FIG. 14 is a schematic diagram of a driver circuit according to an embodiment of the present disclosure. As shown in FIG. 14, the driver circuit includes a plurality of shift registers 100. The shift registers 100 are cascaded. Each shift register 100 includes a signal input terminal IN and a signal output terminal OUT. The signal input terminal IN of the shift register 100 in the next stage is connected to the signal output terminal OUT of the shift register 100 in the previous stage, and the signal input terminal IN of the shift register 100 in the first stage is connected to a starting signal STV. The structure of the shift register 100 has been described in the aforementioned embodiments, and will not be repeated in detail herein. With the design of these embodiments of the present disclosure, the output states of the signal output terminals out of the shift registers 100 in each stage are more stable in each period, and the overall performance stability of the driver circuit can be ensured.

Figure 15:
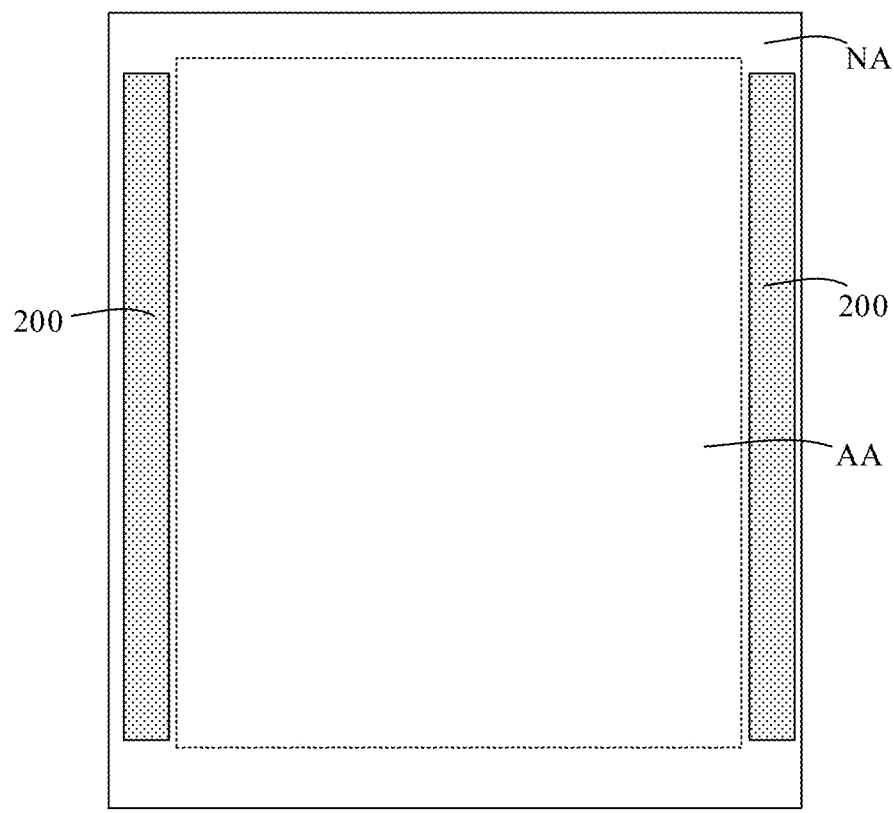
FIG. 15 is a schematic diagram of a display panel according to an embodiment of the present invention.

Based on the same inventive conception, an embodiment of the present disclosure further provides a display panel. FIG. 15 is a schematic diagram of a display panel according to an embodiment of the present disclosure. As shown in FIG. 15, the display panel includes a driver circuit 200. The driver circuit 200 may be any one of these embodiments of the present disclosure. The display panel includes a display area AA and a non-display area NA. The driver circuit 200 is located in the non-display area NA. FIG. 15 schematically shows that the driver circuit 200 is set at both sides of the display area AA. In other embodiments, the driver circuit according to these embodiments of the present disclosure is provided at one side of the display area AA, which is not shown in the drawings.

Figure 16:
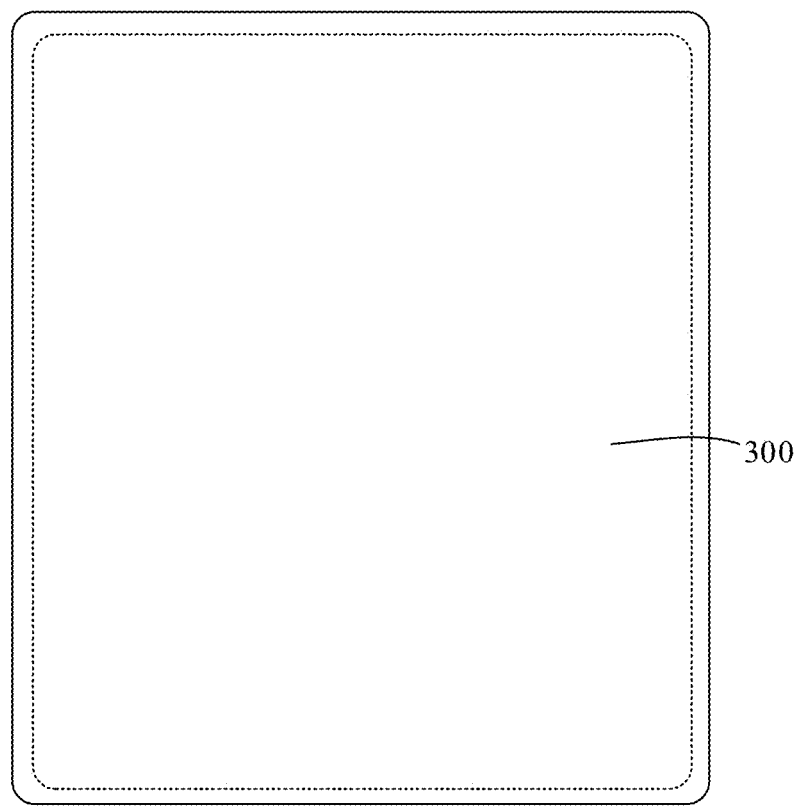
FIG. 16 is a schematic diagram of a display apparatus according to an embodiment of the present disclosure.

Based on the same inventive conception, an embodiment of the present disclosure further provides a display apparatus. FIG. 16 is a schematic diagram of a display apparatus according to an embodiment of the present disclosure. As shown in FIG. 16, the display apparatus includes a display panel 300. The display panel 300 may be any one of these embodiments of the present disclosure. The display apparatus may be, for example, an electronic device such as a mobile phone, a tablet computer, a notebook computer, a television, or a watch.

The above descriptions are merely preferred embodiments of the present disclosure, and are not intended to limit the present disclosure. Any modifications, equivalent replacements, improvements, and the like made within the spirit and principle of the present disclosure shall fall within the protection scope of the present disclosure.

Finally, it should be noted that the foregoing embodiments are merely intended to describe and not to limit the technical solutions of the present disclosure. Although the present disclosure has been described in detail with reference to the foregoing embodiments, persons skilled in the art should understand that they can still make modifications to the technical solutions described in the foregoing embodiments or make equivalent replacements to some or all of the technical features thereof. These modifications or replacements do not make the essence of the corresponding technical solutions deviate from the scope of the technical solutions of the embodiments of the present disclosure.

What is claimed is:

1. A shift register, comprising:
  a first input unit coupled to a first node and configured to write a signal into the first node;
  a first output unit, comprising:
    a control terminal coupled to the first node,
    a first terminal configured to receive a first voltage signal, and
    a second terminal coupled to a signal output terminal;
  a second input unit coupled to a second node and configured to write a signal into the second node;
  a second output unit, comprising:
    a control terminal coupled to the second node,
    a first terminal configured to receive a first clock signal, and
    a second terminal coupled to the signal output terminal; and
  a holding unit comprising an output terminal coupled to the second node, and configured to maintain a potential of the second node at least during a period when the first output unit is off and the second output unit is on,
  wherein the holding unit comprises:
  a first subunit, comprising:
    an output terminal coupled to a third node; and
    a first transistor, comprising:
      a control terminal configured to receive the first clock signal,
      a first terminal of the first transistor coupled to the third node, and
      a second terminal of the first transistor coupled to the second node;
    wherein during the period when the first output unit is off and the second output unit is on, the first subunit inputs a second voltage signal to the third node, and when the first transistor is turned on, the first transistor writes the second voltage signal into the second node to maintain the potential of the second node.

2. The shift register according to claim 1, wherein the first subunit further comprises:
  a control terminal coupled to the control terminal of the first output unit or coupled to the control terminal of the second output unit,
  a first terminal configured to receive the second voltage signal, and
  a second terminal coupled to the third node.

3. The shift register according to claim 2, wherein the first subunit comprises a second transistor, and the second transistor comprises:
  a first terminal configured to receive the second voltage signal;
  a second terminal coupled to the third node; and
  a control terminal coupled to the control terminal of the first output unit or coupled to the control terminal of the second output unit.

4. The shift register according to claim 3, wherein the control terminal of the second transistor is coupled to the control terminal of the first output unit, the second transistor is an n-type transistor, and other transistors in the shift register are p-type transistors.

5. The shift register according to claim 3, wherein the control terminal of the second transistor is coupled to the control terminal of the second output unit, and all transistors in the shift register are p-type transistors.

6. The shift register according to claim 1, wherein the shift register comprises a third transistor, and the third transistor comprises:
  a first terminal coupled to the second node,
  a second terminal coupled to the control terminal of the second output unit, and
  a control terminal configured to receive the second voltage signal.

7. The shift register according to claim 1, wherein the holding unit is further configured to maintain the potential of the second node during a period when the first output unit is on and the second output unit is off;
  wherein the holding unit further comprises a second subunit, and the second subunit comprises an output terminal coupled to the third node; and
  wherein during the period when the first output unit is on and the second output unit is off, the second subunit inputs the first voltage signal to the third node, and when the first transistor is turned on, the first transistor writes the first voltage signal into the second node to maintain the potential of the second node.

8. The shift register according to claim 7, wherein the second subunit comprises a fourth transistor and the fourth transistor comprises:
  a control terminal coupled to the first node,
  a first terminal configured to receive the first voltage signal, and
  a second terminal coupled to the third node.

9. The shift register according to claim 1, wherein the first input unit comprises a fifth transistor, and a sixth transistor,
  the fifth transistor comprises:
    a control terminal coupled to the second node,
    a first terminal configured to receive a second clock signal, and
    a second terminal coupled to the first node; and
  the sixth transistor comprises:
    a control terminal receiving the second clock signal,
    a first terminal configured to receive a second voltage signal, and
    a second terminal coupled to the first node.

10. The shift register according to claim 1, wherein the second input unit comprises a seventh transistor, and the seventh transistor comprises:
  a control terminal configured to receive a second clock signal, a first terminal coupled to a signal input terminal, and a second terminal coupled to the second node.

11. The shift register according to claim 1, wherein a working cycle of the shift register comprises a first output stage and a second output stage, and the first output stage is prior to the second output stage;

in the first output stage, the second input unit is turned on to write a signal into the second node, and the first input unit is turned on to write a signal into the first node; a potential of the first node controls the first output unit to be turned on, and the potential of the second node controls the second output unit to be turned on; and in the second output stage, the first input unit is turned on to write a signal into the first node, and the potential of the first node controls the first output unit to be turned off; the second input unit is turned off, and the holding unit is turned on to maintain the potential of the second node; and the potential of the second node controls the second output unit to be turned on.

12. The shift register according to claim 11, wherein the working cycle of the shift register further comprises a third output stage, and the third output stage is subsequent to the second output stage; and in the third output stage, the first input unit is turned off, and the potential of the first node controls the first output unit to be turned on; the second input unit is turned off, and the holding unit is turned on to maintain the potential of the second node; and the potential of the second node controls the second output unit to be turned off.

13. A driver circuit, comprising a shift register, wherein the shift register comprises:

a first input unit coupled to a first node and configured to write a signal into the first node;

a first output unit, comprising:
  a control terminal coupled to the first node,
  a first terminal configured to receive a first voltage signal, and
  a second terminal coupled to a signal output terminal;

a second input unit coupled to a second node and configured to write a signal into the second node;

a second output unit, comprising:
  a control terminal coupled to the second node,
  a first terminal configured to receive a first clock signal, and
  a second terminal coupled to the signal output terminal; and a holding unit comprising an output terminal coupled to the second node, and configured to maintain a potential of the second node at least during a period when the first output unit is off and the second output unit is on, wherein a plurality of the shift registers are cascaded, wherein the holding unit comprises:

a first subunit, comprising:
  an output terminal coupled to a third node; and a first transistor, comprising:
  a control terminal configured to receive the first clock signal,
  a first terminal of the first transistor coupled to the third node, and
  a second terminal of the first transistor coupled to the second node;

wherein during the period when the first output unit is off and the second output unit is on, the first subunit inputs a second voltage signal to the third node, and when the first transistor is turned on, the first transistor writes the second voltage signal into the second node to maintain the potential of the second node.

14. A display apparatus, comprising a display panel, wherein the display panel comprises a driver circuit, wherein the driver circuit comprises a shift register, and wherein the shift register comprises:

a first input unit coupled to a first node and configured to write a signal into the first node;

a first output unit, comprising:
  a control terminal coupled to the first node,
  a first terminal configured to receive a first voltage signal, and
  a second terminal coupled to a signal output terminal;

a second input unit coupled to a second node and configured to write a signal into the second node;

a second output unit, comprising:
  a control terminal coupled to the second node,
  a first terminal configured to receive a first clock signal, and
  a second terminal coupled to the signal output terminal; and a holding unit comprising an output terminal coupled to the second node, and configured to maintain a potential of the second node at least during a period when the first output unit is off and the second output unit is on, wherein a plurality of the shift registers are cascaded, wherein the holding unit comprises:

a first subunit, comprising:
  an output terminal coupled to a third node; and a first transistor, comprising:
  a control terminal configured to receive the first clock signal,
  a first terminal of the first transistor coupled to the third node, and
  a second terminal of the first transistor coupled to the second node;

wherein during the period when the first output unit is off and the second output unit is on, the first subunit inputs a second voltage signal to the third node, and when the first transistor is turned on, the first transistor writes the second voltage signal into the second node to maintain the potential of the second node.

\* \* \* \* \*